(12) United States Patent
Itoh

(10) Patent No.: US 6,541,340 B2
(45) Date of Patent: Apr. 1, 2003

(54) METHOD OF MANUFACTURING A SEMICONDUCTOR DEVICE WITH A CONCAVE TRENCH

(75) Inventor: Masanori Itoh, Tokyo (JP)

(73) Assignee: Oki Electric Industry Co, Ltd., Tokyo (JP)

( * ) Notice: Subject to any disclaimer, the term of this patent is extended or adjusted under 35 U.S.C. 154(b) by 0 days.

(21) Appl. No.: 10/058,095

(22) Filed: Jan. 29, 2002

(65) Prior Publication Data

US 2002/0066927 A1 Jun. 6, 2002

Related U.S. Application Data

(62) Division of application No. 09/679,364, filed on Oct. 5, 2000, now Pat. No. 6,376,892.

(30) Foreign Application Priority Data

Jun. 13, 2000 (JP) ........................................ 2000-176468

(51) Int. Cl.[7] .............................................. H01L 21/336
(52) U.S. Cl. ........................ 438/270; 438/381; 438/430; 438/578
(58) Field of Search ................................ 438/190, 192, 438/238, 268, 270, 381, 430, 576, 578

(56) References Cited

U.S. PATENT DOCUMENTS

| | | | |
|---|---|---|---|
| 5,619,061 A | 4/1997 | Goldsmith et al. ......... | 257/528 |
| 6,051,468 A | 4/2000 | Hshieh ...................... | 438/270 |
| 6,153,489 A * | 11/2000 | Park et al. .................. | 438/381 |
| 6,248,429 B1 | 6/2001 | Akram et al. ............... | 428/210 |
| 6,261,892 B1 * | 7/2001 | Swanson .................... | 438/238 |

FOREIGN PATENT DOCUMENTS

| | | |
|---|---|---|
| JP | 03101149 A | 4/1991 |
| JP | 10321804 A | 12/1998 |

* cited by examiner

*Primary Examiner*—Chandra Chaudhari
(74) *Attorney, Agent, or Firm*—Rabin & Berdo, P.C.

(57) ABSTRACT

A semiconductor device and a method of manufacturing the same are provided which are novel and fully improved and are capable of lowering satisfactorily a high-frequency resistance or direct current resistance in a signal line. The semiconductor device is composed of a semiconductor substrate on which predetermined circuit devices are mounted, an insulating film formed on the substrate in a manner that it covers the circuit devices and a conductive path formed on the insulating film to electrically connect the circuit devices. A concave trench is formed in a predetermined position on the semiconductor substrate and the conductive path is formed at a bottom of the concave trench in a manner that it extends along the concave trench, with interlayer dielectrics interposed between conductive layers constituting the conductive path.

8 Claims, 3 Drawing Sheets

PRIOR ART

METHOD OF MANUFACTURING A SEMICONDUCTOR DEVICE WITH A CONCAVE TRENCH

CROSS-REFERENCE TO RELATED APPLICATION

This is a division of application Ser. No. 09/679,364, now U.S. Pat. No. 6,376,892, filed Oct. 5, 2000.

BACKGROUND OF THE INVENTION

1. Field of the Invention

The present invention relates to a semiconductor device and a method of manufacturing the same and more particularly to the semiconductor device provided with a conductive path having a stacked structure formed on a semiconductor substrate on which predetermined circuit devices are mounted and to its manufacturing method.

2. Description of the Related Art

A conventional MMIC (Monolithic Microwave Integrated Circuit) includes a semiconductor substrate made of, for example, GaAs (Gallium Arsenide), where circuit devices including active elements such as an FET (Field Effect Transistor) or the like or passive elements such as an inductor, capacitor, bonding pad or a like are mounted. A conductive path functioning as a signal line is used to connect the above circuit devices electrically and to transmit a high-frequency signal thereto. The signal line, together with the semiconductor substrate on which the signal line is formed and a dielectric composed of an insulating film between the semiconductor substrate and the signal line, constitutes a microstrip line. As the signal line constituting the microstrip line, a conductive path having a wiring structure, for example, in which there are two layers up and down may be used.

The configurations of a conventional conductive path functioning as the signal line formed on a semiconductor device such as an MMIC will now be described by referring to FIGS. 4 and 5. FIG. 4 is a top view of a conventional microstrip line 400 having a signal line constructed in two layers up and down. FIG. 5 is a cross-sectional view of the signal line of FIG. 4 taken along the line B—B.

As shown in FIG. 5, on a flat surface of a substrate 402 made of, for example, GaAs is formed a first interlayer dielectric 404 having an approximately uniform thickness and at a predetermined place on the first interlayer dielectric 404 is formed a lower layer wiring 406, for example, by a deposition method. At exposed portions of the first interlayer dielectric 404 and on the lower layer wiring 406, a second interlayer dielectric 408 is formed in a manner such that it covers them. In the second interlayer dielectric 408 is formed a contact hole 410 so that the lower layer wiring 406 is partially exposed. At a predetermined place including portions of the contact hole 410 on the second interlayer dielectric 408 is formed an upper layer wiring 412 by a plating method and the upper layer wiring 412 is electrically connected through the contact hole 410 to the lower layer wiring 406. A passivation film 414 is formed on exposed portions of the second interlayer dielectric 408 and on the upper layer wiring 412. The upper layer wiring 412 described above is formed by a known lift-off method by using a resist film for forming the upper layer wiring (not shown). That is, the resist film is first formed on the second interlayer dielectric 408. Then, patterning is performed on the resist film so as to form an aperture trench corresponding to the desired upper layer wiring 412. The metal for the upper layer wiring is embedded by the plating method and then the resist film together with unwanted metal accumulated on the resist film is removed. Therefore, the thickness of the upper layer wiring is determined by the thickness of the resist film for forming the upper layer wiring described above.

In the conventional conductive path functioning as the signal line, its resistance is made low by constructing the signal line so as to have the wiring structure stacked in two layers up and down, by forming the resist film for forming the upper layer wiring so as to have the large thickness and thus by forming the upper layer wiring having the thickness being as large as possible.

However, the conventional signal line has problems. That is, when the lift-off method described above is employed, since working accuracy is limited by a ratio of a width of the aperture trench to its depth (i.e., aspect ratio), limits are imposed on the thickness of the resist film for forming the upper layer wiring, i.e., on the thickness of the upper layer wiring. By increasing the thickness of the upper layer wiring, an area of cross-section of the conductive path can be made larger, thus allowing a direct current resistance to be made low, for example, in the case of a high-power MMIC. Moreover, by increasing the thickness of the upper layer wiring, a surface area of the conductive path can be made larger, thus allowing a high-frequency resistance caused by a skin effect against the high frequency signal to be lowered. However, as described above, in the conventional wiring structure, since there is the limit in which the thickness of the upper layer wiring is approximately equal to that of the resist film formed by the lift-off method and therefore defining the thickness of the upper layer wiring actually, it is impossible to satisfactorily lower the direct current resistance and high-frequency resistance in the conductive path.

Furthermore, the conventional semiconductor device has another problem in that, since the conductive layer is formed on a flat surface of the semiconductor substrate, the increased thickness of the upper layer wiring causes an increase in an overall height of the semiconductor device.

SUMMARY OF THE INVENTION

In view of the above, it is an object of the present invention to provide a semiconductor device and a method of manufacturing the same which are novel and fully improved and are capable of lowering satisfactorily a high-frequency resistance or direct current resistance in a signal line. It is another object of the present invention to provide a semiconductor device and a method of manufacturing the same which are capable of lowering a resistance in the signal line without causing an increase in an overall height of the semiconductor device. Unlike the conventional semiconductor device in which the conductive path is formed on the flat surface of the semiconductor substrate on which circuit devices are mounted, according to basic configurations of the present invention, the conductive path is formed on a bottom of a concave trench formed in a semiconductor substrate.

According to a first aspect of the present invention, there is provided a semiconductor device comprising:

a semiconductor substrate;

a circuit device mounted on the semiconductor substrate;

an insulating film covering the circuit device;

a conductive path for the circuit devices formed on the insulating film; and wherein the semiconductor substrate is formed a concave trench, at a bottom of which the conductive path is provided in a manner that it extends along the concave trench, with the insulating film interposed between the conductive path and the semiconductor substrate.

In the foregoing, a preferable mode is one wherein the insulating film is formed along a wall face of the concave trench and has an approximately uniform thickness in its all portions to maintain a concave shape of the concave trench.

Also, a preferable mode is one wherein the conductive path is so constructed to have a stacked structure composed of an upper conductive layer, a lower conductive layer and an interlayer dielectric interposed between the two conductive layers and structured so as to provide electric continuity for the two conductive layers.

Also, a preferable mode is one wherein the conductive path constitutes a part of a microstrip line used suitably for a high-frequency current.

According to a second aspect of the present invention, there is provided a method for manufacturing a semiconductor device having a semiconductor substrate, a circuit device formed on the semiconductor substrate, an insulating film covering the circuit device and a conductive path used for the circuit device formed on the insulating film, comprising steps of:

forming a concave trench on the semiconductor substrate;

forming the insulating film having an approximately uniform thickness in their all portions on the semiconductor substrate to maintain a shape of the concave trench; and forming the conductive path on the insulating film in the concave trench.

In the foregoing, a preferable mode is one wherein the conductive path is so constructed to have a stacked structure composed of an upper conductive layer, a lower conductive layer and an interlayer dielectric interposed between the two conductive layers and structured so as to allow electric continuity for the two conductive layers and the concave trench is defined by a flat bottom face and by a pair of sloped side faces having a distance between them which increases gradually as it moves upward from the bottom face, and further including:

forming the lower conductive layer on the insulating film existing on the bottom face of the concave trench;

forming the interlayer dielectric having an approximately uniform thickness in a portion being exposed from the lower conductive layer existing on the insulating film and on the lower conductive layer in a manner that a surface shape of the interlayer dielectric maintains a shape of the concave trench;

forming a contact hole reaching the lower conductive layer in the interlayer dielectric;

forming a photoresist film on the interlayer dielectric having the contact hole;

removing selectively a concave portion of the photoresist film corresponding to the concave trench including a concave region corresponding to the contact hole;

accumulating conductive materials for the formation of the upper conductive layer on the photoresist film including the concave portion from which the photoresist film is removed; and forming the upper conductive layer having a shape corresponding to the sloped side faces by removing unwanted conductive materials existing on the photoresist film together with the photoresist film.

BRIEF DESCRIPTION OF THE DRAWINGS

The above and other objects, advantages and features of the present invention will be more apparent from the following description taken in conjunction with the accompanying drawings in which.

DESCRIPTION OF THE PREFERRED EMBODIMENTS

Best modes of carrying out the present invention will be described in further detail using various embodiments with reference to the accompanying drawings. In the descriptions and figures of the embodiment described below, the same reference number is assigned to any part having the same functions and configuration and its double description is omitted accordingly.

Embodiment

An embodiment of the present invention will be hereinafter described by taking, as an example, the construction of a signal line formed in a semiconductor device such as an MMIC.

In a semiconductor device including the MMIC of the embodiment of the present invention, on a semiconductor substrate (made of, for example, GaAs) on which circuit devices including active elements such as an FET or a like and passive elements such as an inductor, capacitor, bonding pad or a like are fabricated, is formed a signal line having a wiring structure, with two layers up and down to electrically connect the circuit devices and to transmit a high-frequency signal thereto. Unlike in the case of the conventional signal line, according to the present invention, the signal line is formed in a concave trench on the GaAs substrate.

Figure 1:
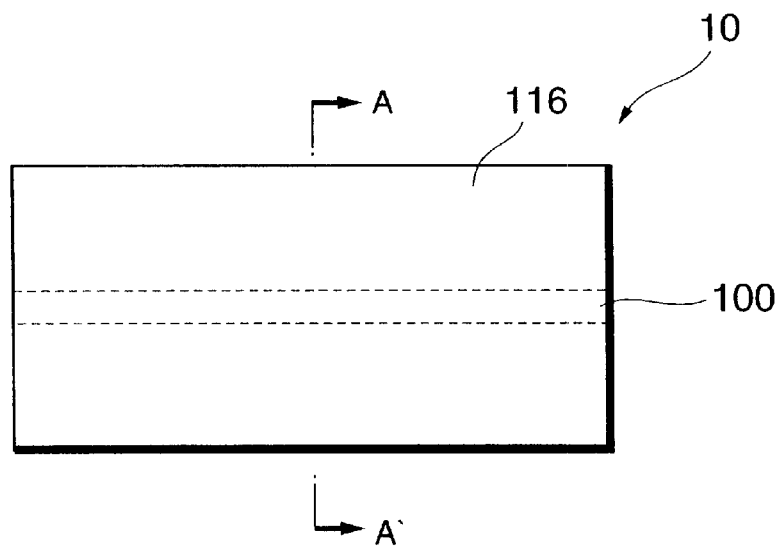
FIG. 1 is a top view of a microstrip line of a semiconductor device according to an embodiment of the present invention.
Figure 2:
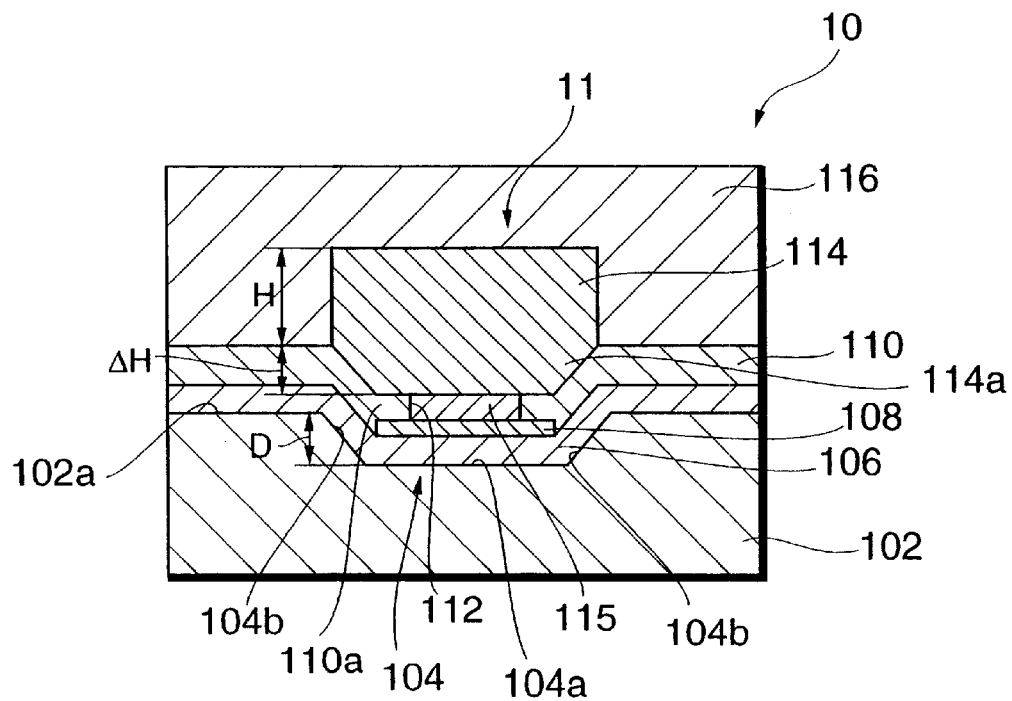
FIG. 2 is a cross-sectional view of the microstrip line of the semiconductor device of FIG. 1 taken along the line A—A'.

The signal line of the embodiment will be described below by referring to FIGS. 1 to 3. FIG. 1 is a top view of a microstrip line of the semiconductor device according to the embodiment. FIG. 2 is a cross-sectional view of the microstrip line of the semiconductor device of FIG. 1 taken along the line A—A' to explain the structure of the signal line of the embodiment.

The semiconductor device 10 of the embodiment has the microstrip line 100, as shown in FIG. 1.

As shown in FIG. 2, the microstrip line 100 of the embodiment is provided with the semiconductor substrate 102, a insulating film 106 formed on the substrate 102 and a conductive path 11 formed on the insulating film 106. The semiconductor substrate 102 consists of, for example, GaAs. Unlike in the case of the conventional embodiment in which the conductive path 11 is formed on a flat surface 102a of the GaAs substrate 102 on which circuit devices are mounted, according to the embodiment of the present invention, the conductive path 11 is formed in the concave trench 104 having a predetermined depth of D disposed in a predetermined position on the flat surface 102a of the substrate 102. In the example shown FIG. 2, the conductive path 11 is formed as the signal line having the wiring structure in two layers up and down (that is, one above the other) composed of a lower conductive layer and an upper conductive layer.

On the GaAs substrate 102 is formed the concave trench 104 having the depth of D which is defined by a flat bottom face 104a and by a pair of sloped sides 104b rising from both sides of the bottom face upward in a manner that a distance between the both sides is increased gradually. Moreover, on the substrate 102 is formed an insulating film 106 having an approximately uniform thickness so that it serves to maintain a shape of the concave trench 104. On the insulating film 106 at the bottom 104 of the concave trench 104 is formed, for example, by a deposition method, the lower conductive layer extending along the concave trench 104, i.e., a lower layer wiring 108. In the portion being exposed from the lower layer wiring 108 on the insulating film or first interlayer dielectric 106 and on the lower layer wiring is formed a second interlayer dielectric 110. The interlayer dielectric 110 has an approximately uniform thickness and has a concave-shaped portion 110a corresponding to the trench shape of the concave trench 104. At a bottom of the concave-shaped portion 110a is formed a contact hole 112 being opened toward the lower layer wiring 108. The upper conductive layer, i.e., upper layer wiring 114 is formed, for example, by a plating method, along the concave-shaped portion 110a on the interlayer dielectric 110. The upper layer wiring 114 is provided with a stem section 115 passing through the contact hole 112. The upper layer wiring 114 is electrically connected to the lower layer wiring 108 through the stem section 115. As described above, since the upper layer wiring 114 is formed along the concave-shaped portion 110a on the interlayer dielectric 110, a lower portion 114a of the upper layer wiring 114 is formed in a manner that its shape can correspond to the flat bottom face 104a of the concave trench 104 and to a pair of sloped sides 104b. The lower portion 114a is integrally connected to a main portion of the upper layer wiring 114 having a height of H relative to the flat surface of the second interlayer dielectric 110 and has a depth of 切H in a downward direction extruding along the concave-shaped portion 110a. The depth of 切H is approximately equal to the depth D of the concave trench 104.

As described above, in the embodiment of the present invention, by mounting the signal line in the concave trench 104 formed in the semiconductor substrate, without causing an increase in an overall height of the conductive path 11, the thickness of the upper layer wiring 114 can be made larger by an amount corresponding to the depth of D of the concave trench 104, compared with the case of the conventional upper layer wiring. This allows the height of the upper conductive layer of the conductive path 11 to be made larger and a cross-sectional area of and a surface area of the conductive path 11 to be increased, thus enabling its direct current resistance and high-frequency resistance to be lowered.

Figure 3A:
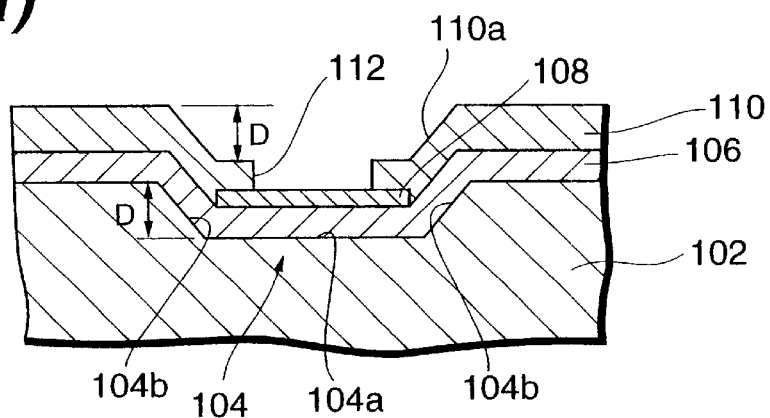
FIGS. 3(a), 3(b) and 3(c) are cross-sectional views of the microstrip line functioning as a signal line to explain a method of manufacturing the semiconductor device according to the embodiment of the present invention.
Figure 3B:
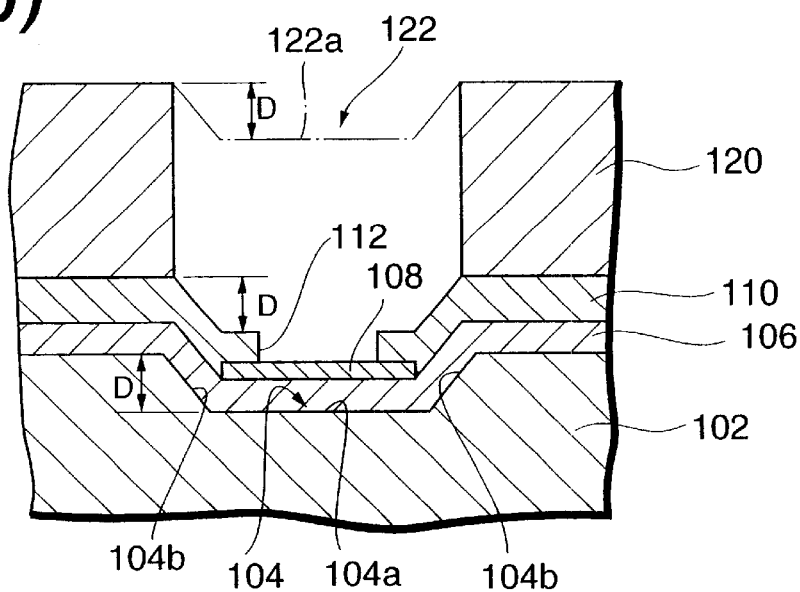
Figure 3C:
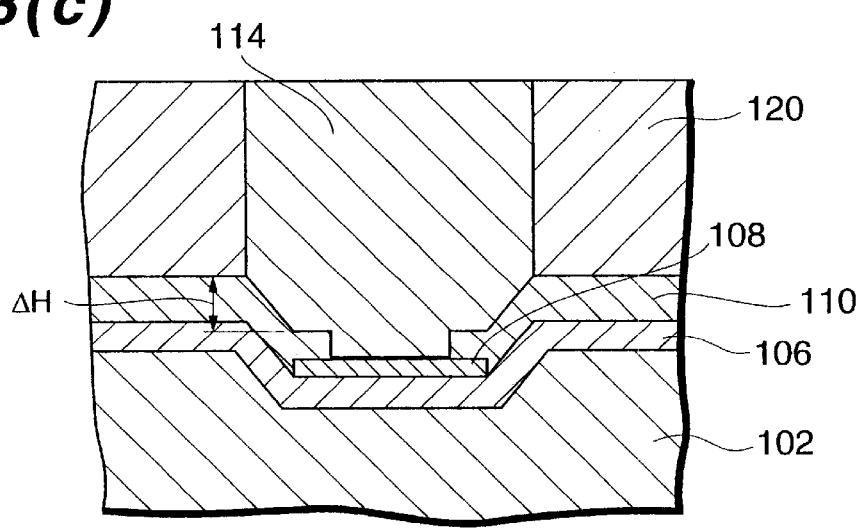
Figure 4:
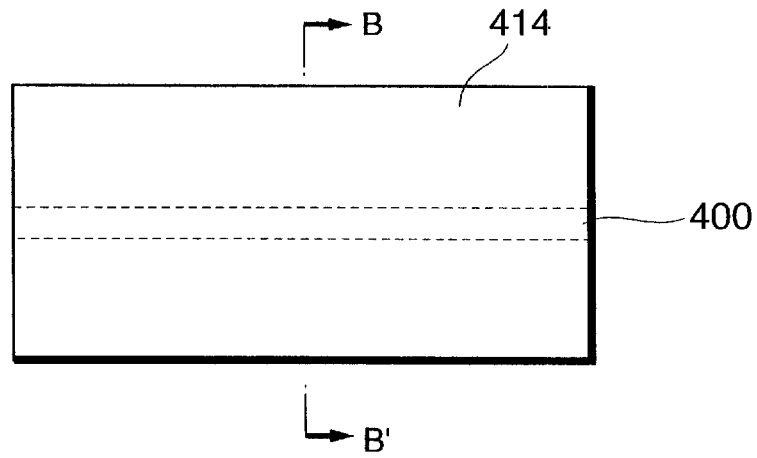
FIG. 4 is a top view of a microstrip line of a conventional semiconductor device.
Figure 5:
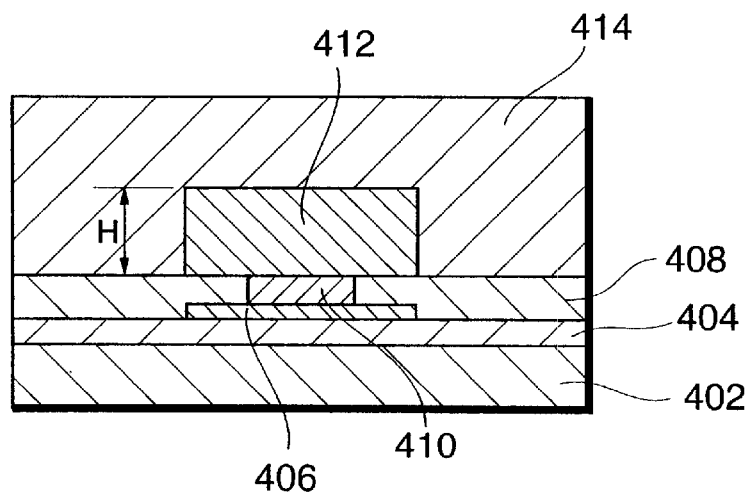
FIG. 5 is a cross-sectional view of the microstrip line of the conventional semiconductor device of FIG. 4 taken along the line B—B.

Next, a method of manufacturing the semiconductor device of the embodiment of the present invention will be described by referring to FIGS. 3(a) to 3(c). FIGS. 3(a), 3(b) and 3(c) are cross-sectional views of the microstrip line functioning as the signal line to explain the method of manufacturing the semiconductor device according to the embodiment.

First, as shown in FIG. 3(a), in a predetermined position on the GaAs substrate 102 on which specified circuit devices (not shown) are mounted is formed the concave trench 104 having a predetermined depth of D by an etching method. The shape of the concave trench 104 is defined by the flat bottom face 104a and a pair of sloped sides 104b. Then, on the GaAs substrate 102 in which the concave trench 104 is formed is provided the first interlayer dielectric or insulating film 106 and on the surface of the insulating film is maintained the shape of the concave trench corresponding to the concave trench 104. Moreover, the lower layer wiring 108 extending along the concave trench 104 is formed, by a deposition method, in a portion corresponding to the flat bottom face 104a of the concave trench 104 on the insulating film 106. Next, in a portion being exposed from the lower layer wiring 108 on the insulating film 106 and on the lower layer wiring 108 is formed the interlayer dielectric 110 having an approximately uniform thickness. On the interlayer dielectric 110 is formed the concave-shaped portion 110a. Therefore, the concave-shaped portion 110a has the depth of D being approximately equal to that of the concave trench 104. The contact hole 112 is formed by the specified etching on the concave-shaped portion 110a in a manner that the lower layer wiring 108 of the interlayer dielectric 110 is opened.

Next, as shown in FIG. 3(b), on the interlayer dielectric 110 in which the contact hole 112 is provided is applied a resist film 120 to be used for the formation of the upper layer wiring 114. In the resist film 120 is a concave portion 122a having a depth D corresponding to that of the concave-shaped portion 110a on the interlayer dielectric 110. By removing a predetermined region including the concave portion 122a and the contact hole 112 using a well-known selective exposure method and development process, an aperture portion 122 extending along the concave trench 104 is formed in the resist film 120 used for the formation of the upper layer wiring 114. The aperture portion 122 in the resist film 120 has a shape corresponding to that of the concave trench 104 and makes exposed the concave-shaped portion 110a of the interlayer dielectric 110 in which the contact hole 112 is formed. In the aperture portion 122 in the resist film 120 is formed the upper layer wiring 114 by, for example, the plating method. When the plating method is performed, upper layer wiring materials, i.e., upper conductive layer materials are accumulated on the interlayer dielectric 110 in the aperture portion 112 in the resist film. Since the concave-shaped portion 110a of the interlayer dielectric 110 corresponding to the shape of the concave trench 104 in the GaAs substrate is formed in the aperture portion 122 in the resist film 120, the plating thickness of the upper layer wiring 114 can be made larger by an amount of a height 切H being equal to the depth D of the concave-shaped portion 110a. Then, in the same manner as in the lift-off method, the resist film 120, together with unwanted upper conductive layer materials accumulated on the resist film 120 to be used for the formation of the upper layer wiring is removed. Finally, a passivation film 116 is formed to cover the upper layer wiring 114.

As described above, according to the embodiment of the present invention, the bottom of the aperture portion of the resist film to be used for the formation of the upper layer wiring has the concave-trench shape, the upper layer wiring can be formed which has a thickness (H+切H) being larger than the thickness H being equal to that of the resist film to be used for the formation of the upper layer wiring. That is, even if the resist film to be used for the formation of the upper layer wiring having the same thickness as is obtained by the conventional method is formed, the thickness of the upper layer wiring can be made by an amount of the height 却H corresponding to the depth of D of the concave trench. In this method, since the thickness of the resist film to be used for the formation of the upper layer wiring is the same as can be obtained by the conventional method, the thickness of the semiconductor device is not increased. As a result, it is made possible to lower the direct current resistance in the signal line and the high-frequency resistance more satisfactorily, compared with the conventional case.

Thus, according to the present invention, since the conductive path is formed on the concave trench provided in the semiconductor substrate, the thickness of the conductive path can be made larger compared with the conventional case. As a result, the direct current resistance in the conductive path can be made lower compared with the conventional case and the high-frequency resistance can be made lower compared with the conventional case as well. Since the upper layer wiring having the thickness being higher than that of the resist film to be used for the formation of the upper layer wiring even by using the resist film having the same thickness as the conventional one, the thickness of the upper layer wiring can be made larger without causing an increase in an overall thickness of the semiconductor device.

It is apparent that the present invention is not limited to the above embodiment but may be changed and modified without departing from the scope and spirit of the invention. For example, in the above embodiment, as the semiconductor substrate on which predetermined circuit devices are mounted, the GaAs substrate is employed, however, other substrate using an Si (silicon) substrate, Inp (Indium Phosphide) substrate or a like may be used as well. Moreover, in the above embodiment, the present invention is applied to the microstrip line used as the conductive path, however, it can be also applied to a direct current conductive path.

What is claimed is:

1. A method for manufacturing a semiconductor device having a semiconductor substrate, a circuit device formed on said semiconductor substrate, an insulating film covering said circuit device, and a microstrip line coupled to said circuit device formed on said insulating film, comprising:
   (a) forming a concave trench on said semiconductor substrate, said concave trench having a predetermined shape;
   (b) forming said insulating film on said semiconductor substrate so that said insulating film has an approximately uniform thickness in all portions thereof to maintain the shape of said concave trench; and
   (c) forming said microstrip line on said insulating film in said concave trench, step (c) including
      (c-1) forming an elongated lower conductive layer in said trench,
      (c-2) forming an interlayer dielectric layer over the lower conductive layer,
      (c-3) forming a contact hole reaching said lower conductive layer in said interlayer dielectric, and
      (c-4) forming an elongated upper conductive layer over said trench, said upper conductive layer contacting said lower conductive layer through said contact hole.

2. A method for manufacturing a semiconductor device having a semiconductor substrate, a circuit device formed on said semiconductor substrate, an insulating film covering said circuit device and a conductive path used for said circuit device formed on said insulating film, comprising:
   (a) forming a concave trench on said semiconductor substrate, said concave trench having a predetermined shape;
   (b) forming said insulating film on said semiconductor substrate so that said insulating film has an approximately uniform thickness in all portions thereof to maintain the shape of said concave trench; and
   (c) forming said conductive path on said insulating film in said concave trench,
   wherein said conductive path is constructed so as to have a stacked structure composed of an upper conductive layer, a lower conductive layer, and an interlayer dielectric interposed between said two conductive layers and structured so as to allow electrical connection of said two conductive layers,
   wherein said concave trench is defined by a flat bottom face and by a pair of sloped side faces that are spaced apart by a distance which increases gradually moving upward from said bottom face, and
   wherein step (c) comprises:
      forming said lower conductive layer on a portion of said insulating film existing on said bottom face of said concave trench;
      forming said interlayer dielectric so that it has an approximately uniform thickness in a portion adjacent said lower conductive layer in a manner such that said interlayer dielectric has a surface shape conforming to said concave trench;
      forming a contact hole reaching said lower conductive layer in said interlayer dielectric;
      forming a photoresist film on said interlayer dielectric having said contact hole;
      removing selectively a concave portion of said photoresist film corresponding to said concave trench, including a concave region corresponding to said contact hole;
      accumulating conductive materials for forming said upper conductive layer on said photoresist film, including the concave portion from which said photoresist film is removed; and
      forming said upper conductive layer so that it has a shape corresponding to said sloped side faces by selectively removing conductive materials existing on said photoresist film together with said photoresist film.

3. The method of claim 2, wherein said lower conductive layer has a predetermined width, and said upper conductive layer has a width that is substantially greater than the width of the lower conductive layer.

4. The method of claim 2, wherein said upper conductive layer has a side that is substantially parallel to one of the sloped side faces of the concave trench.

5. The method of claim 1, wherein step (c-4) comprises:
   forming a photoresist film on said interlayer dielectric;
   selectively removing a portion of said photoresist film over said trench to form an elongated recess;
   depositing conductive material on said photoresist film and in said recess; and
   removing said photoresist film and the conductive material on said photoresist.

6. The method of claim 5, wherein said lower conductive layer has a width, and wherein the step of selectively removing a portion of said photoresist film is conducted so as that said recess has width greater than said width of said lower conductive layer.

7. The method of claim 1, wherein said lower conductive layer has a width, and step (c-4) is conducted so that said upper conductive layer has a width greater than said width of said lower conductive layer.

8. The method of claim 1, wherein said trench as a flat bottom face and a pair of sloped side faces, and said upper conductive layer has a substantially flat face that is substantially parallel to one of said sloped side faces.

* * * * *